United States Patent [19]

Lockwood

[11] 4,405,868

[45] Sep. 20, 1983

[54] WRITE/RESTORE/ERASE SIGNAL GENERATOR FOR VOLATILE/NON-VOLATILE MEMORY SYSTEM

[75] Inventor: George C. Lockwood, Dayton, Ohio

[73] Assignee: NCR Corporation, Dayton, Ohio

[21] Appl. No.: 272,605

[22] Filed: Jun. 11, 1981

Related U.S. Application Data

[63] Continuation-in-part of Ser. No. 20,123, Mar. 13, 1979, abandoned.

[51] Int. Cl.³ .................. H02M 7/537; H03K 5/02; H03L 5/00
[52] U.S. Cl. .................. 307/296 A; 307/264; 363/60; 365/226
[58] Field of Search ............ 307/264, 270, 296 A, 307/353; 363/59, 60; 365/226–229

[56] References Cited

U.S. PATENT DOCUMENTS

| | | | |
|---|---|---|---|
| 3,676,717 | 7/1972 | Lockwood | 307/251 X |
| 3,821,627 | 6/1974 | Milovancevic | 363/60 |
| 3,845,331 | 10/1974 | Luscher | 307/304 |
| 3,955,353 | 5/1976 | Astle | 307/DIG. 1 X |
| 4,000,412 | 12/1976 | Rosenthal et al. | 363/60 X |
| 4,001,664 | 1/1977 | Hyltin | 363/59 |
| 4,016,476 | 4/1977 | Morokawa et al. | 363/59 |
| 4,053,821 | 10/1977 | Hose, Jr. et al. | 363/60 |
| 4,061,929 | 12/1977 | Asano | 307/296 A X |
| 4,123,671 | 10/1978 | Aihara et al. | 307/270 |
| 4,141,064 | 2/1979 | Nagashima | 363/60 |

Primary Examiner—Larry N. Anagnos
Attorney, Agent, or Firm—J. T. Cavender; Philip A. Dalton; Casimer K. Salys

[57] ABSTRACT

A signal generator for producing, from a low voltage power supply, relatively large magnitude pulse signals of opposite polarity to a device input terminal having a parallel resistor-capacitor circuit connection to a reference voltage. A voltage multiplier powered by the low voltage power supply provides a multiplied voltage output which is stored on a first large capacitor. A second large capacitor has one terminal connected to the device input terminal. To produce the large, opposite polarity signals, a control circuit means operates in conjunction with the voltage multiplier and the first capacitor to produce a predetermined sequence of voltages on the second terminal of the second capacitor.

5 Claims, 8 Drawing Figures

WRITE/RESTORE/ERASE SIGNAL GENERATOR FOR VOLATILE/NON-VOLATILE MEMORY SYSTEM

CROSS-REFERENCE TO RELATED APPLICATIONS

This application is a continuation-in-part of my copending application, Ser. No. 020,123, filed Mar. 13, 1979, now abandoned, and is related to my copending application entitled "Static Volatile/Non-Volatile Memory System," Ser. No. 223,506, filed Jan. 8, 1981, and assigned to the assignee of this application as a continuation of Ser. No. 020,124 filed Mar. 13, 1979.

BACKGROUND OF THE INVENTION

This invention relates generally to semiconductor memory systems and, more specifically, to semiconductor memory systems employing random access memory devices which have both volatile and nonvolatile binary data storage capability and which require write and erase voltages of opposite polarity at a magnitude greater than that of the power supply voltage otherwise required to operate the system.

Semiconductor random access memory (RAM) systems generally fall into two categories: static RAM systems and dynamic RAM systems. Static RAM systems typically employ bistable multivibrators or flip-flops with the stored bit value determined by which of the two bistable states the multivibrator is in. Dynamic RAMs typically employ a cell arrangement with the stored bit value determined by the presence or absence of a voltage stored on a semiconductor capacitor structure. Since static RAMs employ bistable devices, the bit content of each cell is retained without refreshing and the readout of the bit content is nondestructive. Dynamic RAMs on the other hand typically require periodic refreshing of the information stored on the capacitor although the readout may be either destructive or nondestructive depending on the cell design. Semiconductor RAMs are generally volatile devices, i.e., the bit content of the memory is typically lost if electric power to the RAM is removed or lost. However, over the past decade or so various approaches have been taken to adding backup nonvolatile storage capability to otherwise volatile RAMs. These RAMs will herein be referred to as volatile/nonvolatile RAMs or simply V/NV RAMs.

In general static RAM cells can be provided with nonvolatile backup data storage capability by adding nonvolatile, threshold-alterable devices of the transistor or capacitor variety to the typical RAM cell. Static V/NV RAM cells incorporating nonvolatile transistors are disclosed in the following exemplary references: Mark et al. U.S. Pat. No. 3,636,530; Lockwood U.S. Pat. No. 3,676,717; an article by Frohman-Bentchkowsky, entitled "The Metal-Nitride-Oxide-Silicon (MNOS) Transistor—Characteristics and Applications", *PROCEEDINGS OF THE IEEE*, Vol. 58, No. 8, August 1970 (page 1218); Uchida et al. U.S. Pat. No. 3,950,737; and Uchida U.S. Pat. No. 4,044,343. Flip-flop cells employing nonvolatile transistor backup devices have been employed in nonvolatile counter circuits manufactured by various companies for electronic artillery fuse applications and for other general purpose uses. They are also employed in several static V/NV RAM integrated circuits (ICs) commercially available from several companies. Static V/NV RAM cells using nonvolatile capacitor elements are disclosed in the following exemplary prior art references: Ho et al U.S. Pat. No. 3,662,351, and Schuermeyer et al. U.S. Pat. No. 4,091,460.

Dynamic V/NV RAM cells employing nonvolatile semiconductor storage devices are shown in the following exemplary references: Aneshansley U.S. Pat. No. 3,761,901; Aneshansley U.S. Pat. No. 3,771,148; Shaffer U.S. Pat. No. 3,774,177; and Schaffer U.S. Pat. No. 3,922,650. A dynamic V/NV RAM system employing nonvolatile devices is also shown in a copending application of Wendell Spence, now issued as U.S. Pat. No. 4,175,291.

Implementation of any of these V/NV static and dynamic RAM systems utilizing five volt, n-channel, silicon-insulator-silicon (SIS) device technology still requires that opposite polarity write and erase voltages having a magnitude of about twenty or twenty-five volts be supplied to the RAMs for writing and erasing information in the nonvolatile storage devices. In the past these opposite polarity write and erase voltages have been supplied either from a DC power supply system capable of providing twenty-five volt signals of both polarities or by employing a single relatively high voltage power supply and providing a circuit for inverting the power supply voltage to an opposite polarity voltage. With the thrust of semiconductor technology strongly in the direction of five volt, n-channel, SIS device technology, it is highly disadvantageous to require a relatively high voltage power supply to be used in the system solely to supply the voltage magnitude requirements for writing and erasing nonvolatile memory components. The manufacturing and operating cost of such power supplies is considerably greater than a single five volt power supply and, accordingly, it would be useful to be able to provide the write and erase voltages required for V/NV memory components from a single five volt power supply.

SUMMARY OF THE INVENTION

The invention set forth and claimed herein comprises a signal generator for supplying relatively large magnitude pulse signals of opposite polarity to a device (such as a V/NV RAM) which has an input terminal impedance equivalent to a parallel resistor-capacitor circuit. The input terminal may be the write/restore/erase terminal of a V/NV RAM requiring opposite polarity write and erase pulse signals. The signal generator is adapted to operate from a power supply providing a first polarity voltage of substantially less magnitude than the large magnitude pulse signals required by the device.

More specifically, the signal generator comprises multiplier circuit means adapted to be coupled to a low voltage power supply for multiplying the magnitude of the power supply voltage and supplying the multiplied voltage at a multiplier output terminal; a first large value capacitor coupled to the multiplier output terminal for storing the multiplied voltage; a second large value capacitor having one terminal adapted to be connected to the input terminal of the device; and control circuit means adapted to respond to control signals on at least one input line for providing, in operating relationship with the multiplier circuit means and the first capacitor a predetermined sequence of voltages on said second terminal of said second capacitor to produce the pulse signals of opposite polarity when said first terminal of said second capacitor is connected to the input terminal of the device. A relatively large magnitude pulse of a first polarity is produced when the second capacitor is in a discharged condition and a positive voltage pulse supplied from said first capacitor is applied to the second terminal of the second capacitor. A relatively large magnitude pulse of an opposite polarity is produced when the second capacitor is in a positively charged condition and a negatively going pulse is applied to the second terminal thereof.

If the signal generator is to be connected to the write/refresh/erase terminal of a V/NV RAM of the type disclosed in my above mentioned copending application and if a noninverted NV/V restore operation is to be performed on the memory cells disclosed therein, the signal generator in accordance with one embodiment of this invention will also produce a short restore voltage pulse of a magnitude about equal to the power supply voltage. This pulse is produced when the second capacitor is in a discharged condition and a positive voltage pulse from said power supply input is applied to the second terminal thereof.

By enabling write and erase signals of plus and minus twenty volts to be generated from a five volt power supply, this invention provides the substantial advantage of enabling a data processing system employing V/NV RAM devices as well as other ICs using n-channel SIS technology to be implemented with a single five volt power supply. This produces a substantial power supply cost advantage. Other features of this invention and advantages thereof will be apparent from a consideration of the detailed description below in conjunction with the accompanying drawings.

DESCRIPTION OF THE PREFERRED EMBODIMENTS

Figure 1:
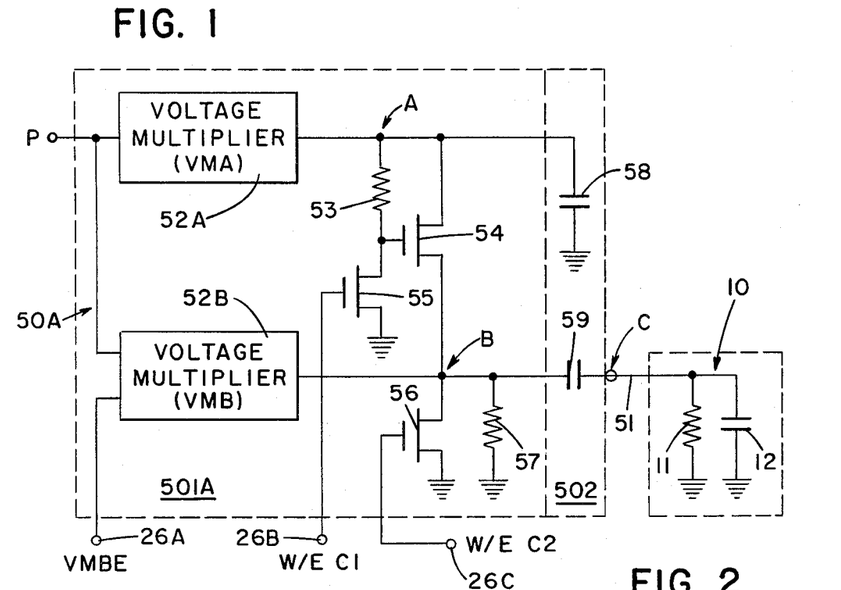
FIG. 1 is a circuit schematic diagram of a signal generator in accordance with one embodiment of this invention.

FIG. 1 depicts a generator 50A having an output terminal C coupled via line 51 to a device 10 (such as a V/NV RAM or a plurality of such RAMs). Capacitor 12 shown in device 10 represents the total capacitance to ground of capacitor structures in device 10 to which line 51 is connected. If device 10 is a V/NV RAM of the type disclosed in my copending application, capacitor 12 is the total capacitance to ground of the nonvolatile capacitors in all of the V/NV RAM cells. Typically such capacitance will be on the order of about 0.001 microfarads. Resistor 11 represents the combined resistance of resistors to ground reference in device 10. If device 10 is a V/NV RAM of the type disclosed in my copending application, resistor 11 is the polysilicon resistor to ground provided on the W/R/E line of such device. The resistance will be on the order of one megohm.

As shown in FIG. 1, signal generator 50A comprises a first voltage multiplier (VMA) 52A and a second voltage multiplier (VMB) 52B respectively coupled to terminals A and B. Both VMA 52A and VMB 52B are powered by a power supply signal P, typically five volts positive for an n-channel, SIS device. VMB 52B also has an input control line 26A labeled VMBE, representing an enable line for that voltage multiplier. The voltage multipliers can be of any design capable of multiplying the five volt DC signal on terminal P to a voltage magnitude at least several times higher. An exemplary version of such a multiplier is shown in Luscher U.S. Pat. No. 3,845,331, issued Oct. 24, 1974, which is readily integratable on an IC chip. The output of VMA 52A is preferably about twenty-five volts, and the output of VMB 52B is preferably about twenty volts if signal generator 50A is to be used to provide write and erase voltages to V/NV RAM devices of the type disclosed in my copending application.

Output terminal A of VMA 52A is coupled to a first large value capacitor 58 for storing the multiplied voltage output. As will later be seen, capacitor 58 provides a twenty-five volt signal at a substantial current magnitude during a particular portion of the operating cycle of signal generator 50A. A 0.1 microfarad value is typically sufficient for capacitor 58 if signal generator 50A is to provide write and erase signal to a V/NV RAM.

Field effect transistor (FET) 54 couples output terminal A of VMA 52A to output terminal B of VMB 52B. Resistor 53 is coupled between output terminal A and the gate electrode of FET 54. FET 55 is coupled between the junction between resistor 53 and the gate electrode of FET 54 and ground reference potential. The gate of FET 55 is connected to terminal 26B designated W/E C1. This terminal is provided with a control signal sequence which turns FET 55 on and off at appropriate times. When FET 55 is on, the gate of FET 54 is grounded and FET 54 is off. When FET 55 is off, resistor 53 biases the gate electrode of FET 54 to a positive voltage, so FET 54 is on. When FET 54 is on, output terminals A and B are effectively coupled together with a five volt drop across FET 54. With FET 54 off, output terminals A and B are effectively decoupled. FET 56 is coupled between output terminal B and ground reference. Resistor 57 is also coupled between output terminal B and ground reference. One terminal of a second large value capacitor 59 (e.g. 0.1 microfarads) is coupled to output terminal B and the other terminal of capacitor 59 is coupled to the signal generator output terminal C. FET 56 has its gate electrode coupled to input terminal 26C designated W/E C2. This control terminal is provided with a control signal sequence which turns FET 56 on and off at appropriate times during the operating cycle of signal generator 50A. When FET 56 is on, terminal B is effectively clamped to ground potential. When FET 56 is off, output terminal B is connected to ground only through resistor 57. Resistor 57 may be a 10 megohm resistor.

All of the components within the dashed block designated 501A can be formed on a single IC chip. The values of capacitors 58 and 59 are such that they cannot be provided conveniently on an IC chip. Consequently, signal generator 50A typically will comprise an IC chip having terminals to which capacitors 58 and 59 which form part of the signal generator circuit are connected. The amount of control logic integrated on the signal generator chip 501A is optional. The necessary sequence of control signals on terminals 26A, 26B and 26C can either be externally supplied or can be integrated onto the chip employing standard timing and logic circuitry.

Figure 2:
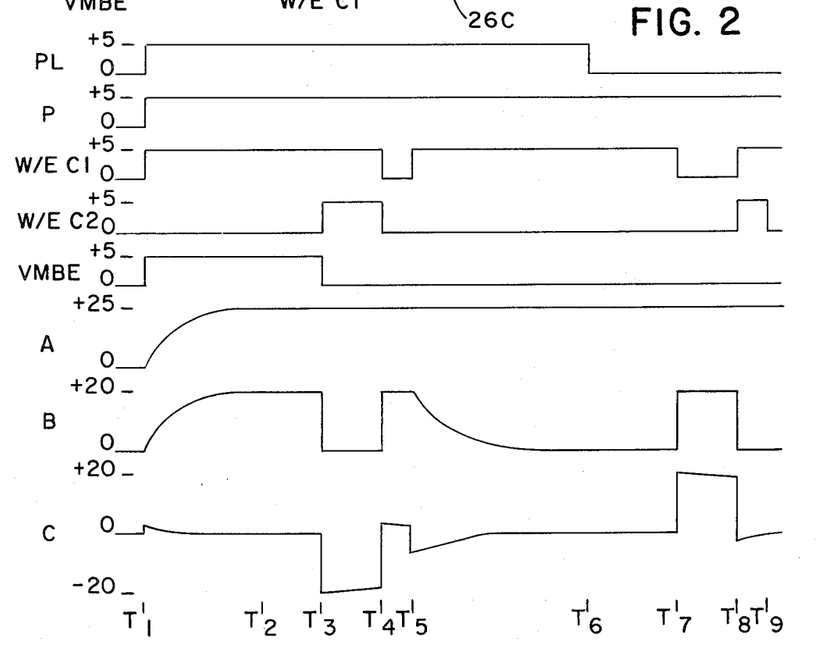
FIG. 2 is an operating signal diagram depicting the operation of the signal generator shown in FIG. 1.

The requisite control logic waveforms for operating signal generator 50A are shown in FIG. 2. For purposes of illustration, it will be assumed that device 10 is the V/NV RAM device shown in my copending application and the V/NV RAM device will employ an inverting NV/V restore operation as disclosed in my copending application. Furthermore it will be assumed that the V/NV RAM device has depletion thresholds in the non-alterable sections of each non-volatile capacitor therein. Accordingly, the NV/V restore operation shown in FIG. 3 of my copending application will be provided by signal generator 50A together with a V/NV write operation and an erase operation. With depletion thresholds in the nonalterable capacitor sections, the control line 51 to the V/NV RAM device 10 need only be at ground potential to produce the inverted restore operation. This is automatically provided in the V/NV RAM chip by resistor 11, provided output terminal C is not supplying a different voltage on line 51. As will be seen, signal generator 50A keeps output terminal C at ground reference potential for a substantial period of time prior to an erase pulse being provided thereon. During this period of time the NV/V restore operation of the V/NV RAM device can be implemented.

Referring now to FIG. 2 in connection with FIG. 1 (and with some reference parenthetically to FIG. 5) a sequence of operations of signal generator 50A will now be set forth. As shown in FIG. 2 the initial condition of the signal generator is a power down condition in which power has been lost to the system for a sufficiently long period of time that the power supply signal P is at ground. Accordingly, all other signals shown are also at ground prior to time $T_1$. It will be assumed that V/NV RAM device 10 has previously been subjected to a V/NV write operation such that data is stored in alterable capacitor sections of each cell in the device. At time $T_1$, power is recovered to the system. Accordingly at this time a Power Line Condition Sense circuit (PLCS) 30 signals CPU 20 (FIG. 5) on a line designated PL that power has been recovered. Power supply signal P on line 41 (FIG. 5) also recovers quickly to the five volt level. At this time CPU 20 causes the W/E C1 signal to go high (+5 volts) and VMBE signal also to go high, leaving W/E C2 low (0 volts). VMA 52A starts operating as soon as P goes high. Since VMBE is brought high by CPU 20, VMB 52B also starts operating. With W/E C2 low, FET 56 is off. With W/E C1 high, FET 55 is on and FET 54 is off. Accordingly, output terminal A of voltage multiplier 52A starts charging toward +25 volts and output terminal B of VMB 52B starts charging towards +20 volts. At output terminal C only a small positive voltage which gradually decays is seen at time $T_1$.

At time $T_2$, the voltages on output terminals A and B have risen to their full value. At this time the voltage on output terminal C is at ground reference, and CPU 20 (FIG. 5) may signal V/NV RAM 10 to perform an NV/V restore operation as disclosed in my copending application. With the restore operation completed, at time $T_3$ CPU 20 signals signal generator 50A to provide the leading edge of an erase pulse by causing W/E C2 to go high and VMBE to go low. With VMBE low, VMB 52B turns off. With W/E C2 high, FET 56 turns on to ground output terminal B. The discharge time constant of the second capacitor 59, together with the resistance value of resistor 11 in V/NV RAM 10 is such that capacitor 59 can discharge only very slowly. Consequently, the negative going twenty volt signal on terminal B at time $T_3$ is fully reflected in a negative going signal on terminal C at the output of signal generator 50A. Since terminal C was previously at ground reference, a negative twenty volt excursion of that signal takes it to a minus twenty volt potential level. Between time $T_3$ and $T_4$ capacitor 59 discharges slightly so that the voltage rises one or two volts, but an effective erase pulse has been generated with a ten millisecond duration typical of the erase pulse duration.

At time $T_4$, W/E C1 goes low and at the same time W/E C2 goes low. Accordingly, FET 56 turns off and FET 55 turns off, causing FET 54 to turn on. When FET 54 turns on, output terminals A and B are coupled together so the positive twenty-five volt signal stored on capacitor 58 is coupled with a high current to output terminal B. This causes output terminal B to rise very quickly to about twenty volts positive. This positive excursion on output terminal B is reflected in a corresponding positive signal excursion on output terminal C, raising terminal C to one or two volts positive. At time $T_5$, W/E C1 goes high, turning on FET 55 so that FET 54 turns off. At this time VMB 52B is still off, so output terminal B is disconnected from all sources of supply voltage. Accordingly, terminal B begins to discharge slowly through high value resistors 57 and 11 toward ground reference potential. Due to this very slow discharge of capacitor 59 through resistor 57 and resistor 11, only a very small negative signal excursion will be seen at output terminal C. Accordingly, at time $T_6$, capacitor 59 has totally discharged, and the signals on both terminals B and C are at ground reference potential. At this point, signal generator 50A is in a condition to generate a positive going write pulse to perform a V/NV write operation on V/NV RAM 10.

It will be assumed that, at time $T_6$, or shortly thereafter, power is lost to the system. Accordingly, PL goes low. Between times $T_6$ and $T_7$, CPU 20 may perform certain housekeeping functions and then cause signal generator 50A to provide a write pulse on output terminal C. Accordingly, at time $T_7$ W/E C1 goes low, turning off FET 55 and accordingly, turning on FET 54. This again couples the plus twenty-five volt signal stored on capacitor 58 and output terminal A to output terminal B. Accordingly, output terminal B rises very quickly to plus twenty volts. Due to the long time constant of the RC network involving resistor 11 and capacitor 59, this positive twenty volt excursion on terminal B is reflected in a positive twenty volt excursion on terminal C. Output terminal C thus rises from ground voltage potential to plus twenty volts. Only a small decline in voltage occurs between time $T_7$ and time $T_8$ such that an effective plus twenty volt write pulse of about ten millisecond duration is generated.

At time $T_8$, W/E C1 goes high and W/E C2 goes high. FET 56 turns on to ground output terminal B while FET 55 turns on and FET 54 correspondingly turns off to decouple terminals A and B. At time $T_8$, the signal on terminal B goes to ground and, with the large time constant of capacitor 59 in series with resistors 11, terminal C also falls to a few volts negative. This terminates the write pulse. Between times $T_8$ and $T_9$ the slight charging of capacitor 59 occurring between $T_7$ and $T_8$ is reversed. At time $T_9$, W/E C2 goes low and FET 56 turns off. Thereafter, power can be lost to the system and a V/NV write operation of V/NV RAM 10 will have been successfully accomplished. The system is then in a condition such that, when power is restored, an NV/V restore operation and an erase operation can be performed utilizing signal generator 50A as previously described.

Figure 3:
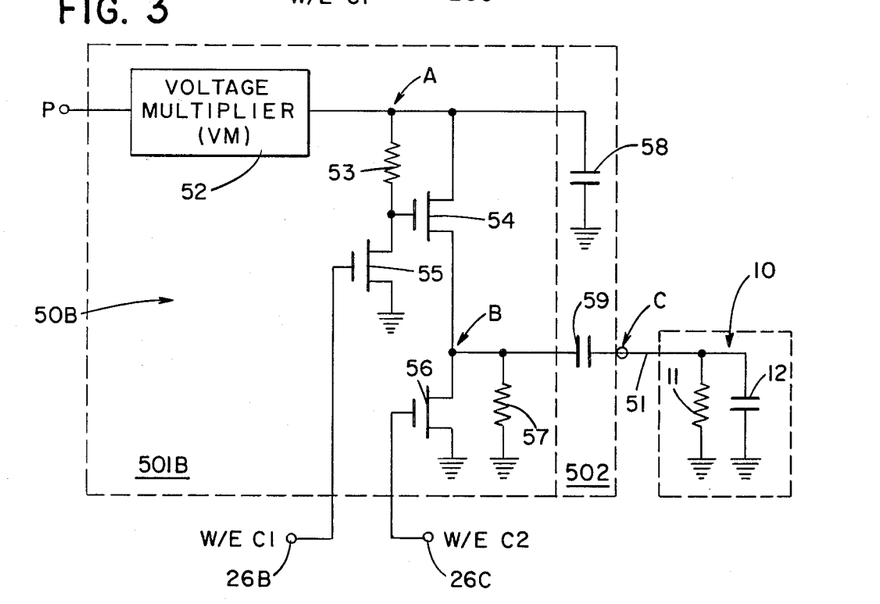
FIG. 3 is a circuit schematic diagram of an alternate embodiment of a signal generator in accordance with this invention.

FIG. 3 shows an alternative embodiment of a signal generator in which one of the voltage multipliers is eliminated. One of the input control signals is also eliminated. However, the sequence of control signals on terminals 26B and 26C is also changed as will now be described in conjunction with FIG. 4. Prior to time $T_1$, the system is in a power off condition. At time $T_1$, power is recovered and PL and P go high. W/E C1 and W/E C2 remain low. Accordingly, FET 56 is off and FET 55 is also off. With FET 55 off, FET 54 is on, coupling output terminal A to terminal B. Accordingly, at time $T_1$, terminals A and B begin charging toward plus twenty-five and plus twenty volts, respectively, with charging current provided by VM 52. The plus twenty-five volt signal is provided by a voltage multiplier VM 52 directly on terminal A. The voltage on terminal B follows that on terminal A less the five volt drop across FET 54.

Figure 4:
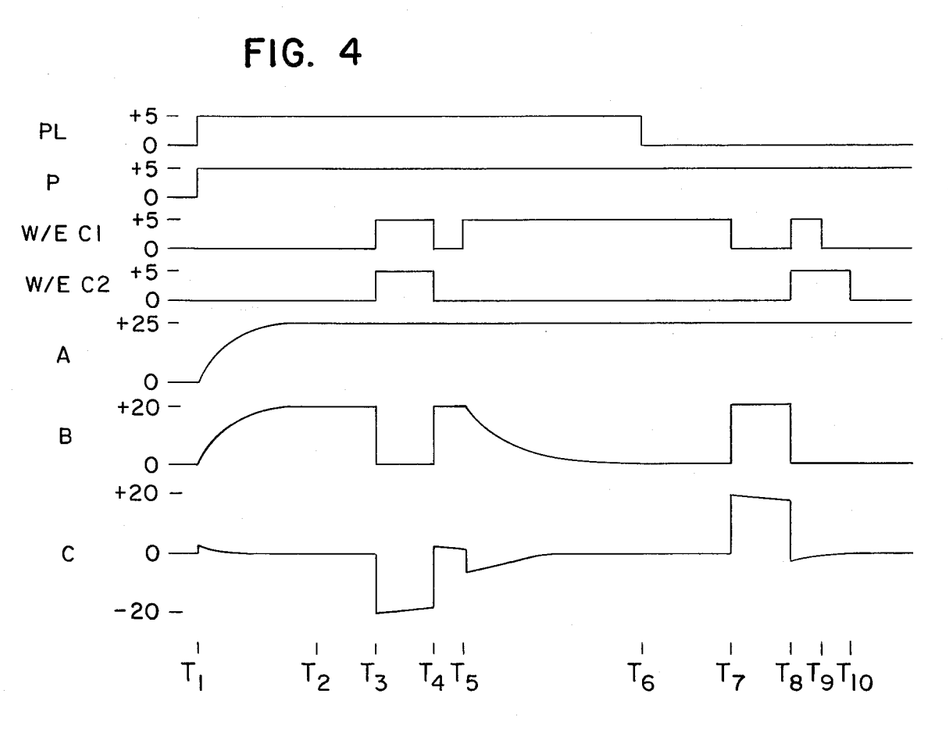
FIG. 4 is an operating signal diagram depicting the operation of the signal generator shown in FIG. 3.

At time $T_2$, the voltages on terminals A and B have reached their full value, and the voltage on terminal C is at ground reference. At this time, CPU 20 can signal V/NV RAM 10 to perform an NV/V restore operation utilizing the ground reference on line 51. This NV/V restore operation is completed before time $T_3$, at which time CPU 20 causes signal generator 50B to provide an erase pulse.

At time $T_3$, both W/E C1 and W/E C2 go high. Accordingly, FET 56 turns on to ground output terminal B. At the same time, FET 55 turns on to ground the gate of FET 54, turning FET 54 off. The voltage on output terminal B drops rapidly from a plus twenty volt level to ground, causing a corresponding drop in the voltage level at output terminal C due to the large time constant of the RC series network involving capacitor 59 and resistor 11. The minus twenty volt signal on capacitor C rises slightly between times $T_3$ and $T_4$ due to a slight charging of capacitor 59. The $T_3$–$T_4$ interval is about ten milliseconds and the negative pulse on line 51 performs a complete erasing of nonvolatile capacitors in V/NV RAM 10. At time $T_4$, both W/E C1 and W/E C2 go low. Accordingly, FET 56 turns off, removing the ground from terminal B. At the same time FET 55 turns off, causing FET 54 to turn on and couple the positive voltage on terminal A to terminal B, less the five volt drop across FET 54. Terminal B rises from ground reference to plus twenty volts, causing a corresponding twenty volt excursion on output terminal C due to the large time constant of capacitor 59 and resistor 11. Accordingly, the signal on terminal C rises from about minus eighteen volts to a few volts positive, terminating the erase pulse.

At time $T_5$, W/E C1 goes high, again causing FET 55 to turn on, thereby causing FET 54 to turn off. At this time, terminal B is disconnected from any supply voltage, and resistor 57 slowly discharges capacitor 59 to ground reference potential at time $T_6$.

Assuming that, at time $T_6$ or shortly thereafter, power is lost to the system, PL goes low. Between time $T_6$ and time $T_7$, CPU 20 can perform certain housekeeping functions and at time $T_7$ it causes signal generator 50B to provide a write pulse on line 51 to perform a V/NV write opertion in V/NV RAM 10. At time $T_7$, W/E C1 goes low and FET 55 turns off, which allows FET 54 to turn on and couple terminal A to terminal B. Thus terminal B rises from ground to plus twenty, causing a corresponding plus twenty volt excursion on output terminal C due to the long charging time constant. Output terminal C rises to the plus twenty volt level required for a write pulse. Between time $T_7$ and $T_8$, capacitor 59 charges only slightly, and at time $T_8$ the voltage is still about plus eighteen volts. A ten millisecond interval between time $T_7$ and time $T_8$ will produce an effective write pulse on line 51 to V/NV RAM 10.

At time $T_8$, both W/E C1 and W/E C2 go high. Accordingly, FET 56 turns on, grounding output terminal B. FET 55 goes on at the same time, grounding the gate of FET 54 and thereby turning it off to decouple terminal B from terminal A. Accordingly, at time $T_8$ the signal on terminal B drops from plus twenty to ground, causing a corresponding negative excursion of the signal on terminal C. Terminal C therefore drops from about eighteen volts positive to a few volts negative at this time. This terminates the write pulse to V/NV RAM 10 on line 51.

At time $T_9$, W/E C1 goes low. FET 56 turns off and capacitor 59 discharges through resistors 57 and 11. At time $T_{10}$, W/E C2 begins to decay toward 0 as the power supply signal decays. At time $T_{10}$, a V/NV write operation has been effectively completed and power loss to the system does not affect the nonvolatile storage of data in V/NV RAM 10. When power is again restored, an NV/V restore operation followed by an erase operation can be provided by signal generator 50B as previously described.

Figure 5:
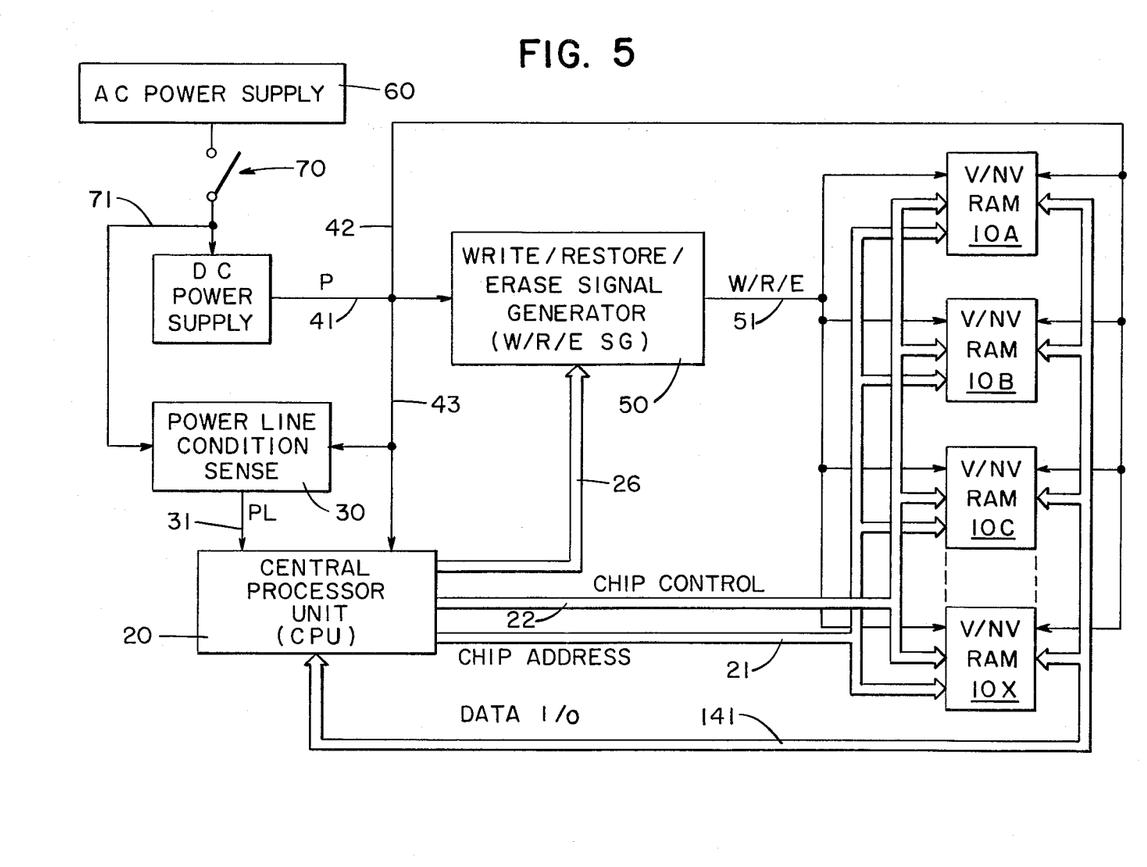
FIG. 5 is a block schematic diagram of an exemplary data processing system employing a signal generator in accordance with this invention together with V/NV RAM components.

FIG. 5 shows a typical data processing system environment in which signal generator 50 may be employed to provide write, restore and erase signals to a plurality of V/NV RAM devices 10A, 10B, 10C . . . 10X. A central processor unit (CPU) 20 provides control signals to the V/NV RAMs 10A through 10X over lines of a chip control bus 22. The CPU also addresses the V/NV RAMs over chip address bus 21. Data flows between CPU 20 and the V/NV RAMs over a data I/O bus 141. Data I/O bus 141 is a bidirectional data bus and is employed for data read out from the V/NV RAMs and data write into V/NV RAMs. An AC power supply 60, typically an outlet box fed from a central AC power generating station, is the primary power supply to the data processing system. Switch 70 is representative of all of the mechanical interconnections between the outlet and the data processing system. These include circuit breakers and system on-off switches and breakers. When closed, switch 70 supplies AC power to DC power supply 40 and to Power Line Condition Sense Circuit (PLCS) 30 over line 71. DC power supply 40 produces a single five volt output on P line 41 which is routed via line 42 as a power source for the V/NV RAMs and via line 43 to the PLCS 30 and CPU 20.

PLCS 30 functions to monitor the presence or absence of AC power to DC power supply 40. When the source of AC power to the DC power supply 40 is lost, PLCS 30 will verify the loss of power and then signal CPU over line 31, called the PL line. DC power supply 40 is constructed such that the P signal on line 41 remains for about forty milliseconds after AC power is lost to the system. This can be accomplished by storing the five volt signal on a large capacitor. W/R/E SG unit 50 functions to provide write, restore and erase signals simultaneously to all of the V/NV RAM devices over W/R/E line 51. The characteristics of the write, restore and erase signals will depend on the requirements of the V/NV RAM system. The most important feature of W/R/E SG unit 50 is its ability to supply, from a single five volt DC power source, opposite polarity write and erase voltages of a magnitude substantially greater than the five volt power supply signal. This frees the system designer from having to provide the opposite polarity write and erase signals by way of a more expensive DC power supply.

Figure 6:
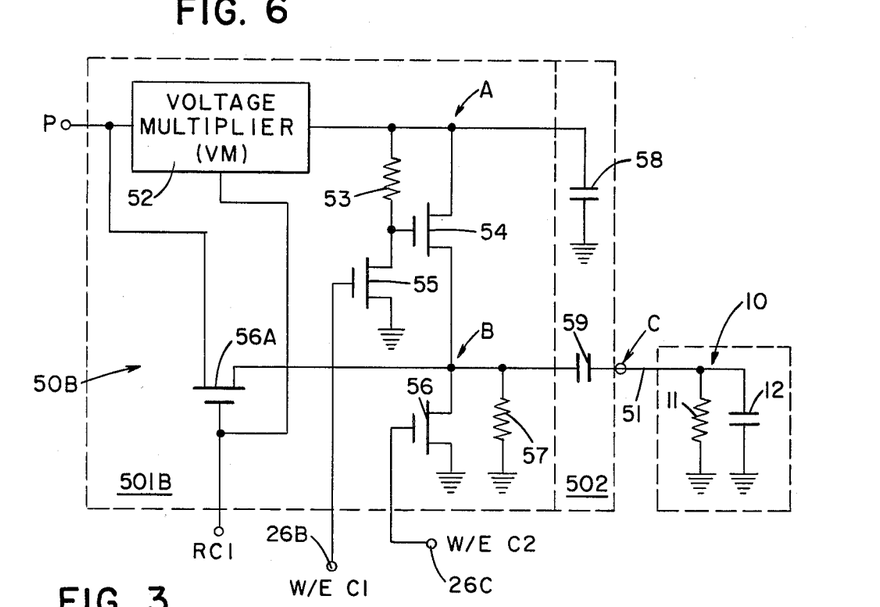
FIG. 6 is a circuit schematic diagram of an alternate embodiment of a signal generator in accordance with this invention.

FIG. 6 shows a signal generator which is identical in structure and operation with that shown in FIG. 3 with the exception of the incorporation of an additional field effect transistor 56A coupled between the five volt power line P and terminal B. The gate electrode of FET 56A is coupled to an input control line labeled RC1. Input control line RC1 is also routed as an enable signal to voltage multiplier 52. This additional circuitry enables the signal generator to provide a short restore pulse at output terminal C after power up. This short four or five volt restore pulse may be used in a noninverting NV/V restore operation of a V/NV RAM as disclosed in my copending application.

Figure 7:
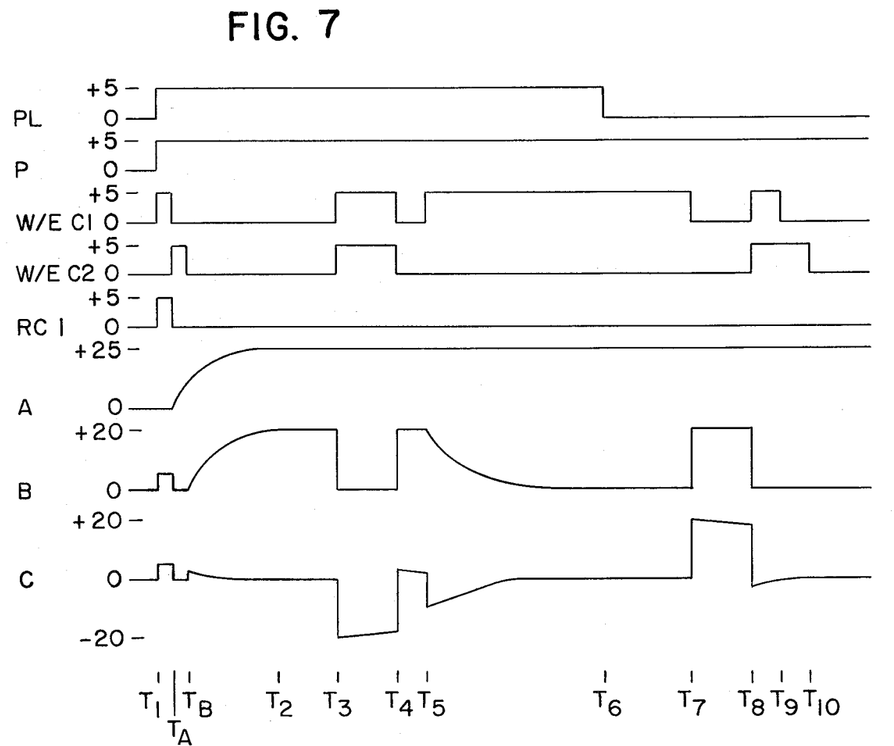
FIG. 7 is an operating signal diagram depicting the operation of the signal generator shown in FIG. 6.

Referring to FIG. 7 in connection with FIG. 6, it will be seen that the operating sequence of the circuit of FIG. 6 to produce erase and write pulses is identical to that of FIG. 3 as shown in the operating signal diagram in FIG. 4. However, FIG. 7 also shows a control signal sequence for producing a short restore pulse between time $T_1$ and $T_4$. At time $T_1$, when power is restored to the system and the power supply line goes high, W/E C1 is driven high and RC1 is driven high at the same time. The RC1 signal is fed to the voltage multiplier 52 to inhibit its operation between time $T_1$ and $T_4$ so that the voltage on terminal A will not be building up during this interval. With W/E C1 high, FET 55 is on and grounds the gate of FET 54 to turn it off. This decouples terminal A from terminal B during this interval. The high signal on line RC1 turns on FET 56A to couple about four volts from power line P to terminal B. Due to the long charging time constant of capacitor 59 and resistor 11, this four volt positive going signal also appears on terminal C.

At time $T_4$, RC1 goes low to turn off transistor 56A and to remove the inhibit from voltage multiplier 52. At the same time, W/E C2 goes high to turn on FET 56 and ground terminal B to terminate the restore pulse at both terminal B and output terminal C. W/E C1 goes low to turn off FET 55 which results in FET 54 turning on to couple terminal A to terminal B. The voltage on terminal A starts rising due to the removal of the inhibit of voltage multiplier 52 at time $T_4$. At time $T_B$, W/E C2 also goes low, turning off FET 56 and permitting the rising voltage on terminal A to be coupled to terminal B. At this time a small positive signal excursion may also appear at output terminal C, but it will have no effect on the already-restored information in V/NV RAM 10. After time $T_B$, the signal generator shown in FIG. 6 functions exactly the same as the one shown in FIG. 3. Consequently, it is unnecessary to repeat a discussion of this operation. The restore pulse produced by the circuit of FIG. 6 is useful in conjunction with either cell 200 in FIG. 1A or cell 300 in FIG. 1B of my copending application to produce a noninverted NV/V restore operation in an NV/V RAM.

Figure 8:
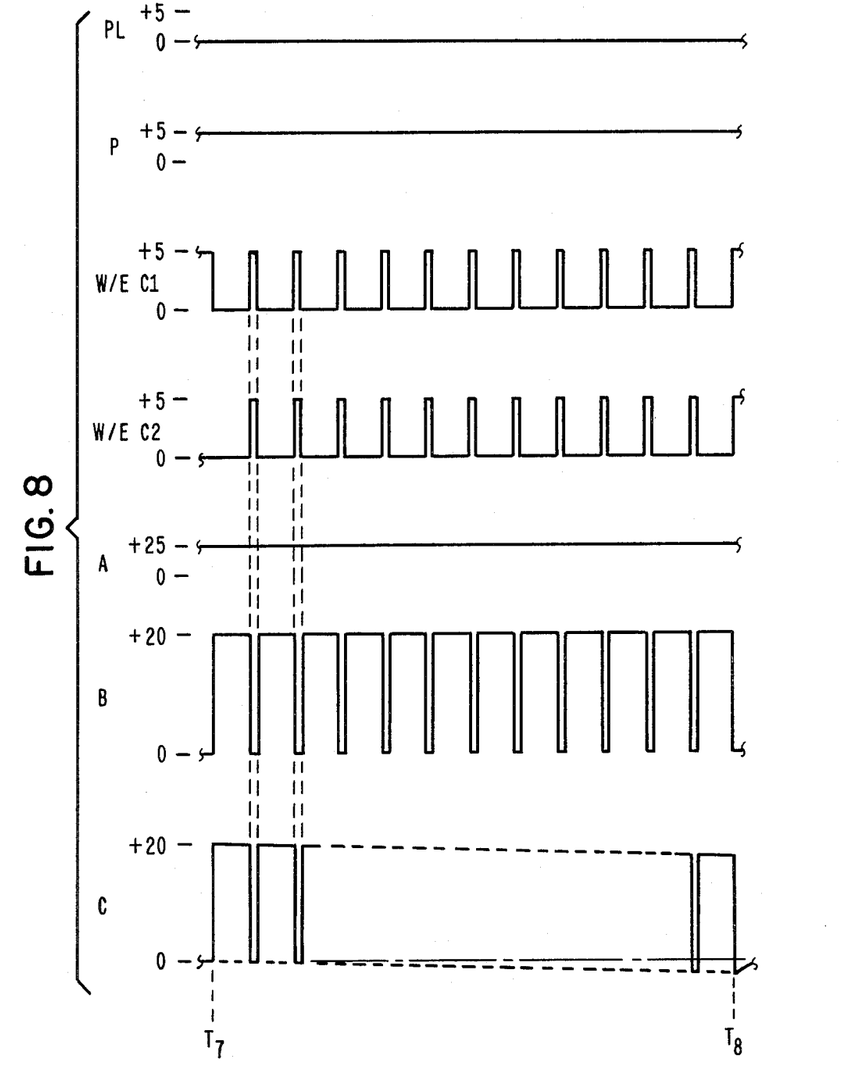
FIG. 8 depicts the signal waveforms for an alternate embodiment, characterized by the substitution of multiple short pulses for the single long write pulse in FIGS. 2, 4 and 7.

Attention is now directed to FIG. 8 of the drawings, where the interval of time between events $T_7$ and $T_8$, originally appearing in FIGS. 2, 4 and 7, is expanded to illustrate the operation of another embodiment of the invention. In this form of practicing the invention, the changes occuring in signals W/E C1 and W/E C2 are cyclically repeated. Namely, the falling edge of W/E C1, at $T_7$, and the concurrent rises of W/E C1 and W/E C2, at $T_8$, are repeated to create a sequence of voltage pulses at terminals B and C. The envelopes of the various multiple pulse signals generated according to this embodiment remain substantially identical to the waveforms previously appearing during the interval between time $T_7$ and $T_8$.

The implementation of this embodiment is responsive to limitations in the present art of V/NV RAM arrays fabricated with MNOS devices. Namely, the ten millisecond write times typically required to reliably program binary states into the array cells is excessive when compared to the preferred write inhibit technique, namely, that utilizing the depletion region to inhibit writing of selected MNOS devices. The present state of the art in cell fabrication frequently results in cells having leakage currents great enough to fill the depletion region "wells" during a continuous ten millisecond interval of time. Without a cyclic removal of the charge carried by such leakage current, the wells associated with the MNOS devices fill to different degrees and write the associated cells to proportionate extents. Since this problem is fairly well recognized, further elaboration is superfluous.

Referring now to FIG. 8, the waveforms of the signals generated by this embodiment and sensed at terminals B and C illustrate the provision for a periodic dissipation of leakage current originated charge. In particular, terminals B and C are cyclically brough to zero potential. The overall envelope, however, retains the plus twenty volt level necessary to write the cells over the full duration of ten milliseconds. The excursions to the zero level actually depicted in FIG. 8 have been exaggerated to illustrate the point being considered. Typically, the zero level exists for approximately one microsecond, though it can extend significantly longer if the application demands. Consequently, the objective underlying this embodiment is to create one or more write pulses, whose cumulative time at the high level is adequate to reliably program V/NV cells in the RAM, and whose individual time at the high level is sufficiently brief that depletion region wells are not filled by leakage currents.

The above descriptions of preferred embodiments of this invention are given by way of example only. It should be understood that numerous modifications could be made therein by persons of ordinary skill in the art without departing from the spirit and scope of this invention as set forth in the claims below.

I claim:

1. A signal generator for supplying relatively large magnitude pulse signals of opposite polarity to a device having an input terminal with a parallel resistor capacitor circuit, said signal generator being operated by a power supply providing a first polarity voltage of substantially less magnitude than said opposite polarity signals and comprising:

multiplier circuit means couplable to said power supply for multiplying the magnitude of said power supply voltage and supplying said multiplied voltage at a multiplier output terminal;

a first large value capacitor coupled to said multiplier output terminal for storing said multiplied voltage;

a second large value capacitor having one terminal connectable to said input terminal of said device; and control circuit means responding to control signals on at least one input line for providing, in operating relationship with said multiplier circuit means and said first capacitor, a predetermined sequence of voltages on said second terminal of said second capacitor to produce said pulse signals of opposite polarity during predetermined different time intervals when said first terminal of said second capacitor is connected to said input terminal of said device, a relatively large magnitude pulse of a first polarity being produced when said second capacitor is in a discharged condition and a positive voltage pulse supplied by said first capacitor is applied to said second terminal of said second capacitor, and a relatively large magnitude pulse of an opposite polarity being produced when said second capacitor is in a positively charged condition and a negative going pulse is applied to said second terminal of said second capacitor.

2. A signal generator as claimed in claim 1 wherein said control circuit means produces a predetermined sequence of voltages on said second terminal of said second capacitor to produce, in addition to said pulse signals of opposite polarity during predetermined different time intervals, a second pulse of a first polarity and a magnitude substantially corresponding with said power supply voltage, said pulse being produced when said second capacitor is in a discharged condition and a positive voltage pulse from said power supply is applied to said second terminal of said second capacitor.

3. A signal generator as claimed in claim 1 wherein said control circuit means comprises a switching transistor coupled between said multiplier output terminal and said second terminal of said second capacitor; a large resistive impedance means connecting said second terminal of said second capacitor to said reference voltage, and a second switching transistor coupled between said second terminal of said second capacitor and said reference voltage, said first and second switching transistors and said large resistive impedance means being responsive to a predetermined sequence of control signals to produce said predetermined sequence of voltages on said second terminal of said second capacitor.

4. A signal generator as claimed in claim 3 wherein said predetermined sequence of voltages on said second terminal of said second capacitor comprises:

a. a first multiplied voltage of a first polarity during a first time interval to charge said second capacitor to said first multiplied voltage, b. ground reference voltage during a second time interval much shorter than the discharge time constant of said second capacitor when connected to said input terminal of said device to produce an opposite polarity signal thereon;

c. said first multiplied voltage during a third time interval to terminate said opposite polarity signal on said input terminal of said device, d. no voltage during a fourth time interval to permit said resistive impedance means to discharge said second capacitor;

e. said multiplied voltage during a fifth interval much shorter than the charging time constant of said second capacitor when connected to said input terminal of said device to produce a first polarity signal thereon; and f. ground reference voltage during a sixth time interval to terminate said first polarity signal.

5. A signal generator as claimed in claim 4 wherein elements 4e and 4f of the predetermined sequence of voltages are cyclically repeated more than one time.

* * * * *